United States Patent
Grass et al.

(10) Patent No.: US 10,655,274 B2
(45) Date of Patent: May 19, 2020

(54) METALLIC OR METALLIZED, GRAPHENIZED REINFORCEMENT

(71) Applicants: COMPAGNIE GENERALE DES ETABLISSEMENTS MICHELIN, Clermont-Ferrand (FR); Michelin Recherche et Technique S.A., Granges-Paccot (CH)

(72) Inventors: Robert Nikolaus Grass, Zurich (CH); Wendelin Jan Stark, Langenthal (CH); Milan Fedurco, Clermont-Ferrand (FR); Antonio Delfino, Clermont-Ferrand (FR); Jean-Paul Meraldi, Zurich (CH)

(73) Assignee: COMPAGNIE GENERALE DES ETABLISSEMENTS MICHELIN, Clermont-Ferrand (FR)

( * ) Notice: Subject to any disclaimer, the term of this patent is extended or adjusted under 35 U.S.C. 154(b) by 679 days.

(21) Appl. No.: 15/319,552

(22) PCT Filed: May 20, 2015

(86) PCT No.: PCT/EP2015/061168
§ 371 (c)(1),
(2) Date: Dec. 16, 2016

(87) PCT Pub. No.: WO2015/193051
PCT Pub. Date: Dec. 23, 2015

(65) Prior Publication Data
US 2017/0137993 A1 May 18, 2017

(30) Foreign Application Priority Data

Jun. 18, 2014 (FR) .................................... 14 55569

(51) Int. Cl.
*D07B 1/06* (2006.01)
*C25D 3/38* (2006.01)
(Continued)

(52) U.S. Cl.
CPC .......... *D07B 1/0666* (2013.01); *B60C 1/0041* (2013.01); *B60C 9/0007* (2013.01);
(Continued)

(58) Field of Classification Search
CPC ...... D07B 1/0666; D02G 3/48; B60C 9/0007; C25D 5/34; C25D 5/36
See application file for complete search history.

(56) References Cited

U.S. PATENT DOCUMENTS 5,958,361 A   9/1999 Laine et al.
6,887,566 B1  5/2005 Hung et al.
(Continued)

FOREIGN PATENT DOCUMENTS

DE  10 2012 109 260 A1   1/2014
WO       01/36332 A1   5/2001
(Continued)

OTHER PUBLICATIONS

W. S. Fulton, "Steel Tire Cord-Rubber Adhesion, Including the Contribution of Cobalt", Rubber Chemistry and Technology, vol. 78, pp. 426-457 (2004).
(Continued)

*Primary Examiner* — Shaun R Hurley
(74) *Attorney, Agent, or Firm* — Venable LLP (57) ABSTRACT

A threadlike metallic or metallized reinforcer, for example a thread, film, tape or cord made of carbon steel, at the periphery of which is positioned a layer of metal referred to as "surface metal" chosen from copper, nickel and copper/nickel alloys, is characterized in that this surface metal layer is itself coated, at least in part, with at least one layer of
(Continued)

graphene; preferably, there is grafted, to this graphene, at least one functional group which can crosslink to a polymer matrix. This reinforcer of the invention is effectively protected from corrosion by virtue of the graphene present at the surface; advantageously, it can be adhesively bonded directly, without adhesion primer or addition of metal salt, to an unsaturated rubber matrix, such as natural rubber, by virtue of the possible functionalization of this graphene.

19 Claims, 6 Drawing Sheets (51) Int. Cl.

| | |
|---|---|
| C25D 5/50 | (2006.01) |
| C25D 7/06 | (2006.01) |
| C23C 16/453 | (2006.01) |
| B60C 1/00 | (2006.01) |
| C01B 32/184 | (2017.01) |
| C01B 32/194 | (2017.01) |
| C01B 32/186 | (2017.01) |
| C23C 16/26 | (2006.01) |
| C25D 5/34 | (2006.01) |
| D02G 3/48 | (2006.01) |
| B60C 9/00 | (2006.01) |
| C25D 5/36 | (2006.01) |

(52) U.S. Cl.
CPC .......... *C01B 32/184* (2017.08); *C01B 32/186* (2017.08); *C01B 32/194* (2017.08); *C23C 16/26* (2013.01); *C23C 16/453* (2013.01); *C25D 3/38* (2013.01); *C25D 5/34* (2013.01); *C25D 5/36* (2013.01); *C25D 5/50* (2013.01); *C25D 7/0607* (2013.01); *D02G 3/48* (2013.01); *B60C 2001/0066* (2013.01); *B60C 2009/0014* (2013.01); *B60C 2009/0021* (2013.01); *D07B 2201/2011* (2013.01); *D07B 2201/2013* (2013.01); *D07B 2205/3007* (2013.01); *D07B 2205/3021* (2013.01); *D07B 2205/3067* (2013.01); *D07B 2205/3071* (2013.01); *D07B 2205/3085* (2013.01); *D07B 2205/3089* (2013.01); *D07B 2205/3092* (2013.01)

(56) References Cited

U.S. PATENT DOCUMENTS

| | | | |
|---|---|---|---|
| 7,211,236 | B2 | 5/2007 | Stark et al. |
| 8,182,573 | B2 | 5/2012 | Stark et al. |
| 8,231,369 | B2 | 7/2012 | Rajala et al. |
| 8,658,188 | B2 | 2/2014 | Stark et al. |
| 2004/0126298 | A1 | 7/2004 | Stark et al. |
| 2004/0173300 | A1* | 9/2004 | Yasunaga .............. B60C 9/0007 152/565 |
| 2008/0268246 | A1 | 10/2008 | Stark et al. |
| 2009/0025846 | A1* | 1/2009 | Miyazaki .............. B60C 9/0007 152/451 |
| 2009/0123357 | A1 | 5/2009 | Chang et al. |
| 2009/0126604 | A1 | 5/2009 | Akhtar et al. |
| 2009/0288747 | A1* | 11/2009 | Miyazaki .............. B60C 9/0007 152/451 |
| 2009/0317504 | A1 | 12/2009 | Rajala et al. |
| 2010/0055340 | A1 | 3/2010 | Park et al. |
| 2011/0314840 | A1 | 12/2011 | Jahangiri-Famenini |
| 2012/0148646 | A1 | 6/2012 | Stark et al. |
| 2013/0143067 | A1 | 6/2013 | Kim et al. |
| 2015/0233373 | A1* | 8/2015 | Sicilian ................. F04C 2/1075 418/48 |
| 2015/0307981 | A1 | 10/2015 | Grass et al. |
| 2015/0352900 | A1 | 12/2015 | Delfino et al. |
| 2017/0121806 | A1 | 5/2017 | Stark et al. |

FOREIGN PATENT DOCUMENTS

| | | |
|---|---|---|
| WO | 2004/005184 A1 | 1/2004 |
| WO | 2004/103900 A1 | 12/2004 |
| WO | 2007/028267 A1 | 3/2007 |
| WO | 2008/049954 A1 | 5/2008 |
| WO | 2011/020204 A1 | 2/2011 |

OTHER PUBLICATIONS

B. Thiebaut, "Flame Spray Pyrolysis: A Unique Facility for the Production of Nanopowders", Platinum Metals Rev., vol. 55, No. 2, pp. 149-151 (2011).

K. Kim, et al., "Raman Spectroscopy Study of Rotated Double-Layer Graphene: Misorientation-Angle Dependence of Electronic Structure", Phys. Rev. Lett., vol. 108, pp. 246103-1-6 (2012).

Y. Wang, et al., "Raman Studies of Monolayer Graphene: The Substrate Effect", J. Phys. Chem. C., vol. 112, pp. 10637-10640 (2008).

* cited by examiner

METALLIC OR METALLIZED, GRAPHENIZED REINFORCEMENT

1. FIELD OF THE INVENTION

The present invention relates to metal or metallized reinforcers which can be used as reinforcing elements for polymer matrices, such as, for example, rubber, in particular in pneumatic or non-pneumatic tyres for vehicles.

It relates more particularly to reinforcers, the surface of which has been treated for the purpose, on the one hand, of protecting them from corrosion and, on the other hand, of making it possible for them to subsequently adhere to ethylenically unsaturated polymer matrices, such as natural rubber, in particular without the use of cobalt salts in these polymer matrices being necessary.

2. PRIOR ART

Composites of metal/rubber type, in particular for tyres, are well known. They are generally composed of a matrix made of unsaturated rubber, generally diene rubber, which can be crosslinked with sulphur, comprising metal reinforcing elements (or "reinforcers"), such as wires or cords made of carbon steel.

As they are subjected to very high stresses during the rolling of the tyres, in particular to repeated actions of compression, bending or variation in curvature, these composites must, in a known way, satisfy a large number of sometimes contradictory technical criteria, such as uniformity, flexibility, flexural strength and compressive strength, tensile strength, wear resistance and corrosion resistance, and must maintain this performance at a very high level for as long as possible.

It is easily understood that the adhesive interphase between the rubber and these reinforcers plays a dominating role in the persistence of the above performance.

The conventional process for connecting the rubber compositions to carbon steel consists in coating the surface of the steel with brass (copper/zinc alloy), the bonding between the steel and the rubber matrix being provided by sulphurization of the brass (formation of zinc and copper sulphides) during the subsequent vulcanization (that is to say, three-dimensional crosslinking by sulphur) of the rubber matrix. This sulphurization process is reflected in particular by the in situ formation of metal clusters at the surface of the brass known as "dendrites", around which it is assumed that the rubber matrix will anchor (by mechanical and chemical anchoring) during the vulcanization.

In addition, organic salts or complexes of cobalt are generally incorporated in this rubber matrix as adhesion-promoting additives. It is known that cobalt actively participates not only in the process of vulcanization of the rubber but also in that of dendritization of the brass by being incorporated in the dendrites themselves (by formation of Cu—Zn—Co intermetal sulphides), according to complex mechanisms of redox reactions resulting, it is assumed, in the corrosion of the brass, in the dissolution of the metal and in its redeposition in the form of these metal sulphide dendrites (sulphur-comprising dendrites). Reference may be made, for further details, to the RCT (*Rubber Chemistry and Technology*) publication, Vol. 78, pp. 426-457, author W. Stephen Fulton, entitled "*Steel tire cord-rubber adhesion, including the contribution of cobalt*").

However, it is also known that the presence of these cobalt compounds in rubber compositions renders the latter more sensitive to oxidation and to ageing, so much so that the adhesion between the carbon steel and the rubber matrix is also liable to weaken over time as a result of the gradual development of the sulphides formed, under the effect of the various stresses encountered, in particular mechanical and/or thermal stresses, it being possible for the above decomposition process in addition to be accelerated in the presence of moisture.

Their incorporation also significantly increases the cost of the rubber compositions, not to mention that it is desirable in the long run to eliminate cobalt from these compositions, due to recent developments in European regulations, cobalt and cobalt salts being regarded as relatively toxic to the environment.

For all the reasons set out above, manufacturers of metal/rubber composites, in particular tyre manufacturers, are on the lookout for novel solutions in order to protect the metal reinforcers from corrosion and to adhesively bond them to the rubber compositions, while overcoming, at least in part, the abovementioned disadvantages.

3. BRIEF DESCRIPTION OF THE INVENTION

In point of fact, during their research studies, the Applicant Companies have found a novel reinforcer corresponding to the above objective.

The present invention relates to a threadlike metallic or metallized reinforcer, at the periphery of which is positioned a layer of metal referred to as "surface metal" chosen from copper, nickel and alloys of copper and nickel, characterized in that this surface metal layer is itself coated, at least in part, with at least one layer of graphene.

According to a particularly preferred embodiment of the invention, there is grafted, to the graphene, at least one functional group which can crosslink to a polymer matrix, thus rendering the reinforcer capable of directly reinforcing this polymer matrix.

The reinforcers according to the invention exhibit as major advantage that of being effectively protected from corrosion, and also of being able subsequently to be adhesively bonded directly, that is to say without adhesion primer or addition of metal salt (in particular of cobalt salt), to unsaturated rubber matrices, such as natural rubber.

While the deposition of a surface metal is admittedly necessary, this technology is simplified with respect to the prior art (brass coating for adhesive bonding to the rubber) as it does not require the deposition both of Cu and Zn, followed by a high-temperature thermal diffusion treatment for formation of brass.

The invention and its advantages will be easily understood in the light of the detailed description and exemplary embodiments which follow, and also of the figures relating to these examples, which represent or schematize:

- a scheme illustrating the principle of a process which makes it possible to obtain a reinforcer according to the invention, and also an example of a device which can be used for the implementation of this process (FIG. 1);
- a scheme illustrating the surface condition of a reinforcer (R) according to the invention, once this reinforcer has been FSP treated, with formation of graphene (GR) at the surface of the surface metal $M_S$ (FIG. 2);
- another scheme illustrating the surface condition of the reinforcer (R) once graphenized and functionalized, with presence of functionalized graphene (GRf) at the surface of the surface metal $M_S$ (FIG. 3);
- a scheme illustrating the crosslinking and the anchoring of the functionalized graphene (GRf), after reaction of its functional groups, to a polymer matrix (18) (FIG. 4);

a reproduction of a TEM photograph taken of a graphene sample withdrawn at the surface of a reinforcer according to the invention (FIG. 5);

a Raman spectrum recorded on another graphene sample withdrawn at the surface of a reinforcer according to the invention (FIG. 6);

a reproduction of an XPS spectrum taken at the surface of a reinforcer according to the invention, after graphenization, clearly confirming the presence of graphene (FIG. 7);

a reproduction of another XPS spectrum taken at the surface of a reinforcer according to the invention, after graphenization and then functionalization, clearly confirming the functionalization of the graphene by amine $NH_2$ groups (FIG. 8).

4. DETAILED DESCRIPTION OF THE INVENTION

In the present description, unless expressly indicated otherwise, the percentages (%) shown are percentages by weight.

Furthermore, any interval of values denoted by the expression "between a and b" represents the range of values extending from more than a to less than b (that is to say, limits a and b excluded), whereas any interval of values denoted by the expression "from a to b" means the range of values extending from a up to b (that is to say, including the strict limits a and b).

The invention thus relates to a threadlike metallic or metallized reinforcer, at the periphery of which is positioned a layer of metal referred to as "surface metal" chosen from copper, nickel and copper/nickel alloys, the tyre being characterized in that this surface metal layer is itself coated, at least in part, with at least one (that is to say, one or more) layer of graphene.

4.1 Reinforcer

"Threadlike" reinforcer is understood to mean, in a way well known to a person skilled in the art, an elongated reinforcer, having a very great length with respect to its section, whatever the shape of this section, for example circular, oblong, rectangular or square, or even flat, this reinforcer, as a result of its great length, being capable of being wound in several turns over a take-up or storage reel; to give an idea, the ratio of its length to the greatest dimension of its cross section is typically greater than $10^3$, preferably greater than $10^4$.

This threadlike reinforcer can be both straight and non-straight, for example twisted or wavy. The thickness (case of a non-circular cross section) of this reinforcer, or its diameter when its cross section is circular in shape, is preferably between 0.05 and 5 mm, more preferably between 0.1 and 1 mm and in particular between 0.12 and 0.50 mm.

According to a specific embodiment, the threadlike reinforcer is an individual thread or an assembly of threads, such as, for example, a cord or a folded yarn, or else a fabric, in particular a twill fabric.

According to another specific embodiment, the threadlike reinforcer is a tape (by convention, having a width of at most 5 cm) or a film (by convention, having a width of greater than 5 cm), the thickness of which, as already indicated above, is preferably between 0.05 and 5 mm, more preferably between 0.1 and 1 mm, in particular between 0.12 and 0.50 mm.

The reinforcer according to the invention can be metallic, that is to say entirely of metal, both at the core and at the periphery, or else simply metallized, in the case of a hybrid reinforcer consisting of metal at its periphery and, at the core, of at least one other non-metal material. Thus it is that the reinforcer might be textile, for example made of aramid, of carbon or of glass, but metallized at its periphery by deposition of a coating of metal, identical to or different from the surface metal $M_S$ proper.

Preferably, the reinforcer is a reinforcer entirely of metal, both at the core and at the skin or at the periphery.

More preferably, the metal at the core of the metal reinforcer is a steel, in particular a carbon steel, it being possible for the latter to be coated or not coated with another optional metal, other than the surface metal $M_S$, consequently positioned between the steel and the surface metal.

The carbon steel is preferably such as normally used in cords of "steel cord" type for tyres; however, it is, of course, possible to use other steels, for example stainless steels. When a carbon steel is used, its carbon content is preferably between 0.4% and 1.2%, in particular between 0.5% and 1.1%. The invention applies in particular to any steel of the normal tensile ("NT"), high tensile ("HT"), super high tensile ("SHT") or ultra high tensile ("UHT") steel cord type.

When the above steel, in particular carbon steel, is coated, at least in part, with a metal referred to as "substrate metal" or "coating metal", consequently acting as substrate for the layer of the surface metal $M_S$, the substrate metal is preferably selected from the group consisting of aluminium, cobalt, tin, manganese, molybdenum, zinc and the alloys comprising at least one of these elements, more preferably selected from the group consisting of cobalt, zinc and the alloys comprising at least one of these elements; this optional substrate metal can in particular be brass.

4.2 Layer of Surface Metal $M_S$

An essential characteristic which is common to all the reinforcers according to the invention is that they are provided at their periphery, prior to the deposition of graphene, with a layer of metal referred to as "surface metal" (metal denoted "$M_S$") on which the graphene is deposited.

This metal $M_S$ is chosen from copper, nickel and the alloys of copper and nickel; preferably, it is copper.

The layer of metal $M_S$ has a thickness which is preferably between 0.1 and 10 μm, more preferably between 0.5 and 5 μm. It can be deposited by any means known to a person skilled in the art, for example by an electrochemical or chemical route.

4.3 Graphenization

An essential characteristic of the reinforcer of the invention is that its surface metal is coated with at least one (that is to say, one or more) graphene layer.

It is obtained, for example and preferably, by a process consisting in depositing, with forward progression, at least one layer of graphene on the surface of a continuous metallic or metallized reinforcer, at the periphery of which is deposited a layer of metal referred to as "surface metal" chosen from copper, nickel and copper/nickel alloys, the said process comprising at least one stage of flame spray pyrolysis, under a reducing atmosphere, of a carbon precursor which generates, in the flame, at least one carbon-based gas which is sprayed onto the surface of the metal reinforcer in forward progression, and is decomposed thereon to form the said graphene layer at the surface of the surface metal.

The term "with forward progression" means, of course, that the continuous reinforcer is in relative movement in the direction of its axis.

This surface treatment thus has the essential characteristic of comprising a stage of flame spray pyrolysis (FSP) of a carbon precursor generating, in the flame, at least one carbon-based gas.

The carbon-based gas formed, preferably carbon monoxide (CO), is propelled, sprayed by the flame towards the surface of the body to be treated, hence the name accorded to this technology.

Flame spray pyrolysis is a method well known today which has been essentially developed for the synthesis of ultrafine powders of simple or mixed oxides of various metals (e.g., $SiO_2$, $Al_2O_3$, $B_2O_3$, $ZrO_2$, $GeO_2$, $WO_3$, $Nb_2O_5$, $SnO_2$, $MgO$, $ZnO$, $Ce_xZr_{(1-x)}O_2$), having controlled morphologies, and/or their deposition on various substrates, this being the case starting from a great variety of metal precursors, generally in the form of comminutable organic or inorganic liquids which are preferably inflammable; the liquids comminuted in the flame, on being consumed, give off in particular metal oxide nanoparticles which are sprayed by the flame itself onto these various substrates.

The principle of this method has been recalled, for example, in the recent (2011) publication by Johnson Matthey entitled *Flame Spray Pyrolysis: a Unique Facility for the Production of Nanopowders*, Platinum Metals Rev., 2011, 55 (2), 149-151. Numerous alternative FSP processes and reactors have also been described, by way of examples, in the patents or patent applications U.S. Pat. No. 5,958,361, WO 01/36332 or U.S. Pat. No. 6,887,566, WO 2004/005184 or U.S. Pat. No. 7,211,236, WO 2005/103900, WO 2007/028267 or U.S. Pat. No. 8,182,573, WO 2008/049954 or U.S. Pat. No. 8,231,369, US 2009/0123357, US 2009/0126604, US 2010/0055340 or WO 2011/020204.

However, to the knowledge of the Applicant Companies, the FSP method had never been used to date for the continuous graphenization of metal or metallized reinforcers, these reinforcers being in particular provided with the surface metal $M_S$ layer described above.

"Carbon precursor" or "carbon-based gas precursor" capable of generating, during its combustion in the flame, at least one carbon-based gas, in particular and preferably carbon monoxide (CO), is understood to mean, in the present patent application, the product which is sprayed into the flame, whatever the form or the presentation of this product. It can be solid (for example in the form of a powder, sprayed into and melted directly in the flame), liquid or else gaseous at ambient temperature (20° C.); preferably, it is liquid or gaseous.

According to a more preferred embodiment, the carbon precursor is gaseous; it is, for example, selected from the group consisting of methane, ethane, propane, acetylene, ethylene and their mixtures.

According to another more preferred embodiment, the carbon precursor is liquid; it is more preferably an aromatic solvent which is liquid at ambient temperature, in particular of the inflammable type; mention will in particular be made of those selected from the group consisting of benzene, toluene, xylene, naphthalene, tetrahydrofuran, ethylhexanoic acid and the mixtures of such compounds.

The FSP treatment can be carried out at any temperature, of course lower than the melting points of the reinforcer (or of one of its constituent elements) and of its surface metal $M_S$. In order to optimize the duration and the effectiveness of the treatment, the temperature of the surface metal $M_S$, during the graphenization, is preferentially between 300° C. and 600° C., preferably between 400° C. and 550° C.

Figure 1:
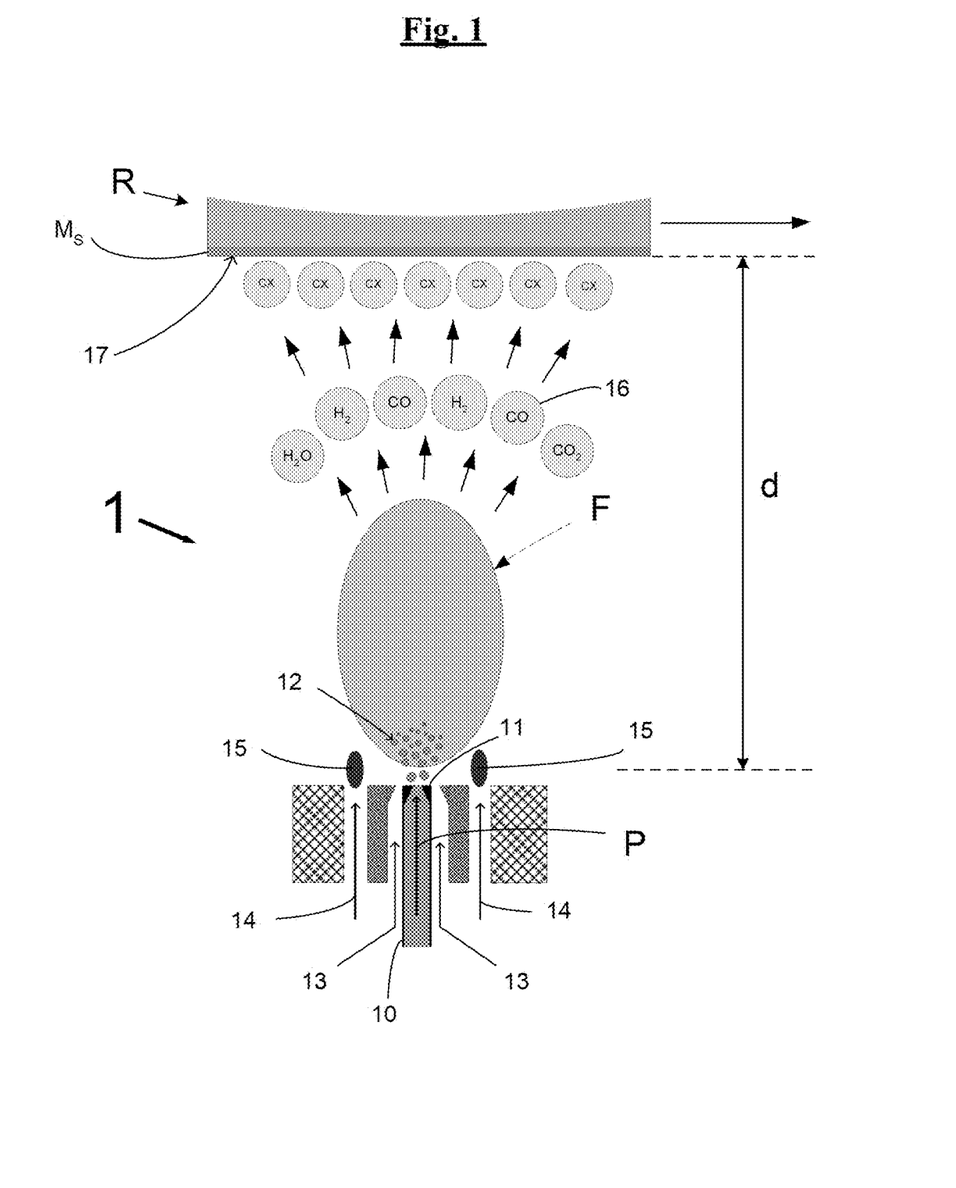

The appended FIG. 1 illustrates, highly diagrammatically, without observing a specific scale, the principle of an FSP (flame spray pyrolysis) process which can be used in the manufacture of the reinforcer of the invention and also an example of a device (1) which can be used in the implementation of this process.

The principle of the method is to inject a carbon-donating precursor (P) and then to comminute it in a flame (F) using a propellant and oxidizing gas; the combustion of the precursor (P) in the flame (F) makes possible the formation of the targeted entity (in this case, a carbon-based gas).

The device 1 of this example essentially comprises three respective feeds:

atomization means (10, 11), comprising at least one capillary (10) and one nozzle (11) for feeding with fuel or precursor (P), for example in liquid or gaseous form, the role of which is to eject and comminute the precursor, for example in the form of fine droplets (12), the shape of the jet being dictated by the specific atomization conditions; these atomization means (10, 11) are, of course, preceded by a pump of appropriate proportions (in the examples which follow, a gerotor rotary volumetric micropump, model "mzr-2905" from HNP Mikrosysteme GmbH), not represented in this figure for simplicity;

a feed of oxidation gas (13) (using a pump not represented in the diagram) which ejects the oxidizing gas into the outlet region of the feed nozzle (11), the role of which is, on the one hand, to propel the droplets (12) into the flame (F) and, on the other hand, to oxidize the precursor (P) in order to convert it into carbon-based gas;

finally, a feed of support gas (ignition and combustion gas) (14), for example a mixture of methane and oxygen, which feeds two small flames (secondary flames) (15) for their part intended to ignite the droplets (12) of precursor (P) for formation of the main flame (F).

It is thus the flame (F) generated by the combustion gas (14) and the oxidizing gas (13) which constitutes the FSP reactor, a thermal reactor at very high temperature since the temperature inside the flame (F), according to the preferred operating conditions given above, is greater than 300° C., for example between 300° C. and 600° C.

It is the combustion in the flame (F) of the precursor (P) in the presence of oxygen (13) which will generate the targeted carbon-based gas (16) and also other gaseous entities depending on the specific nature of the precursor used, these entities preferably being reducing, as explained in more detail below A person skilled in the art will understand that the FSP treatment is in this instance carried out in an atmosphere "depleted in oxygen" (conditions referred to as "reducing flame" or "reducing atmosphere" conditions), that is to say with the minimum of oxygen necessary (the trend is towards incomplete combustion), without which there will be no formation of carbon-based gas (and of other gaseous reducing entities); preferably, the oxygen content in the combustion chamber (measured immediately at the chamber outlet) is less than 200 ppm, in particular within a range from 5 to 200 ppm, preferably less than 100 ppm, in particular within a range from 10 to 100 ppm. The whole of the combustion chamber (in the examples which follow, a simple fitted-out closed glove box) is thus swept with a stream of inert gas, such as nitrogen. The height of the main flame (F) is typically between 5 and 10 cm.

The flame is placed, as a function of the desired intensity of the treatment, at a variable distance from the surface (17) of the surface metal $M_S$ to be treated, which distance a person skilled in the art can easily define as a function of the specific conditions for implementing the invention. This distance, denoted "d" in FIG. 1, measured between the base of the flame (F) and the surface (17) of the metal $M_S$, is preferably between 30 and 100 mm, preferably between 50 and 80 mm and in particular between 55 and 75 mm.

It is the flame (F), by virtue of its kinetic energy, which acts as propellant for the carbon-based gas (16) towards the surface (17) of the metal $M_S$ to be treated.

Without being committed to this theory, it may be supposed a posteriori that the carbon-based gas (CO) produced in the flame is subsequently hydrogenated to form intermediate carbon-based entities (symbolically denoted "CX" in FIG. 1), which in their turn interact with the surface of the surface metal $M_S$ to form the graphene (in one or more layers).

The duration of the graphenization treatment is typically from a few tenths of a second to a few seconds, as a function of the specific conditions for the implementation of the process, in particular according to the rate of forward progression of the reinforcer, of the distance "d" and of the temperature of the flame. By way of example, the rate of forward progression of the reinforcer is between 0.5 cm/s and 50 cm/s, in particular between 1 and 5 cm/s.

The plants which can be used for the implementation of such a process are, of course, not limited to the examples and embodiments described above.

In order to treat, in particular at high speed, large amounts of reinforcers, such as threads, cords, tapes or films, the plants used might, of course, comprise a combination of several flames positioned in line and/or in parallel, which constitutes a major advantage of the present invention. In order to accelerate the treatment, the reinforcers might also be preheated by passing through heating means, such as ovens, or else heated by the Joule effect by passing an electric current through the reinforcers during their graphenization treatment.

Thus, and entirely unexpectedly, by "simple" passage through a flame of appropriate composition, it has proved to be possible to continuously graphenize metallic or metallized reinforcers and to thus effectively protect them their surface, in particular from corrosion.

Figure 2:
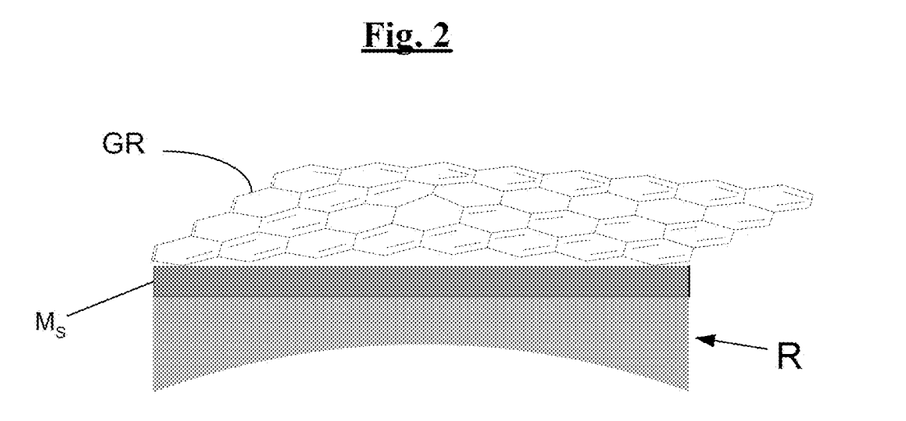

FIG. 2 represents, very diagrammatically, the surface condition of a reinforcer R according to the invention and of its surface metal $M_S$ once it has been treated by FSP, as indicated above.

To recollect, graphene is a carbon monolayer, in the form of benzene nuclei fused together; it has typically been produced in the past from graphite by mechanical exfoliation. It is a two-dimensional (monoplane) crystal of carbon (hexagonal crystal system); each graphene layer, with a thickness equal to approximately 0.4 nm (nanometre), is essentially composed of $sp^2$ hybridized carbon atoms.

Preferably, in accordance with the invention, the reinforcer R comprises from 1 to 5 graphene layers, more preferably from 2 to 4 graphene layers In order to give an idea, with an optical microscope, a graphene monolayer absorbs approximately from 1 to 3% of the visible light. If the total graphene (in the form of a "sheet" comprising superimposed layers) is deposited on a transparent support, after having separated it from the reinforcer R, for example by chemical dissolution of the surface metal $M_S$, it is known that the human eye sees through the graphene sheet up to a number of graphene layers equal to 4. Starting from 5 layers, the graphene sheet will appear black.

According to a particularly preferred embodiment of the invention, the graphenized reinforcer described above is treated for the purpose of grafting, to the graphene, at least one functional group which can crosslink to a polymer matrix, thus rendering the reinforcer capable of directly reinforcing this polymer matrix.

4.4 Functionalization of the Graphene

According to a particularly preferred embodiment of the invention, once the reinforcer has been graphenized (treated by FSP), the latter is treated, preferably still with forward progression, for the purpose of grafting to the graphene, preferably to the outermost layer if several graphene layers are present, at least one functional group which can crosslink to the polymer matrix which it is intended to reinforce, so as to thus render the said reinforcer capable of adhering by crosslinking to this polymer matrix.

The polymer may or may not be ethylenically unsaturated, it being possible for the crosslinking to take place on the unsaturated polymer, or else on components of the polymer matrix other than the polymer itself.

The reinforcer of the invention is preferably a metal reinforcer intended to subsequently adhere to an ethylenically unsaturated rubber matrix, such as a diene elastomer, in order to constitute a metal/rubber composite, such as those normally encountered in rubber articles, such as tyres for motor vehicles. The functional group can, for example, be of the vulcanizable type, that is to say crosslinkable via sulphur bridges.

Preferably, the crosslinkable functional group comprises at least one function, denoted "GF" (Graphene Function), chosen from the —$NH_2$, —NHR (R a hydrocarbon radical), —OH, —COOH, —CHO, —SH, —$S_x$— (polysulphide, "x" greater than 1), halogen (in particular —Cl, —Br, —F), acrylate, methacrylate, epoxy, vinyl, vinyloxy or isocyanate functions.

According to a more preferred embodiment, the crosslinkable functional group comprising the "GF" function corresponds to the formula:

in which:
"m" is equal to 0 or to 1;
"n" is an integer from 1 to 5;
Z is an optional, at least divalent, bonding group (separator or spacer); mention may be made, by way of examples, of an ether —O— bond, a thioether —S— bond, an aliphatic, cycloaliphatic or aromatic hydrocarbon group preferably comprising from 1 to 20 carbon atoms and which can comprise a heteroatom.

According to an even more preferred embodiment, the crosslinkable functional group comprising the "GF" function (in this instance, the primary amine —$NH_2$ function) corresponds to the specific formula which follows:

The functionalization of the graphene, that is to say the grafting to the graphene of functional groups comprising at least one "GF" function as described above, can be carried out by any known means, for example by immersion, in particular with forward progression, in a liquid bath of appropriate formulation.

This liquid bath is, for example, a bath of an aqueous solution containing at least one diazonium salt of formula:

in which Z, GF, "m" and "n" have the definitions already given and X⁻ represents the anion of the salt, for example chlorine.

Figure 3:
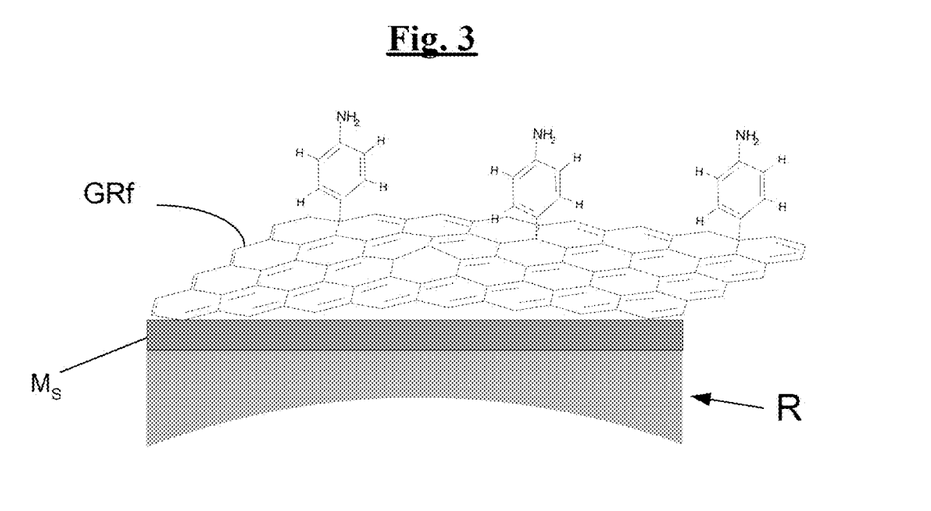

In particular, this diazonium salt has the formula:

FIG. 3 represents very diagrammatically the surface condition of the reinforcer R and of its surface metal $M_S$ once treated by FSP, that is to say graphenized, and then the outermost graphene layer functionalized (graphene denoted "GRf" in the figure) by treatment in an aqueous bath of the above diazonium salt.

Figure 4:
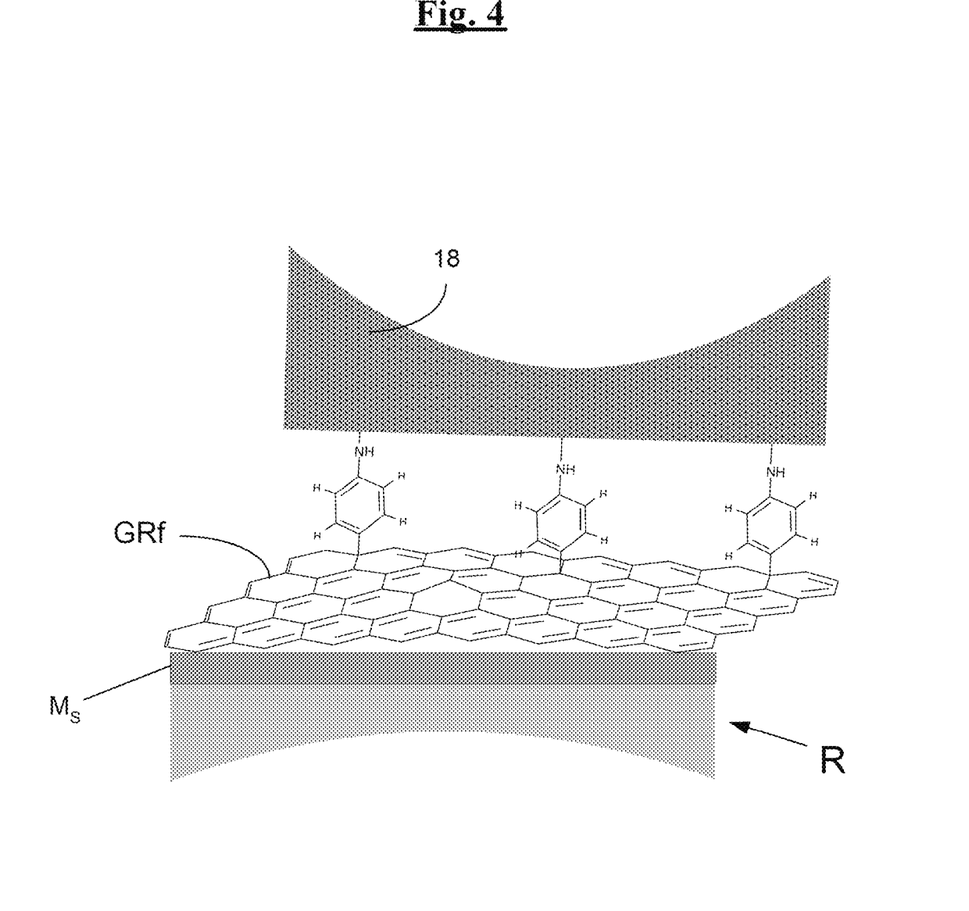

Finally, FIG. 4 is a diagram illustrating very simply the crosslinking, the anchoring of the functionalized graphene (GRf) after reaction of its functional groups (GF) with a polymer matrix (18), such as, for example, epoxidized natural rubber, the epoxy functions of which have reacted with the —$NH_2$ functions of the outermost graphene layer.

5. EXEMPLARY EMBODIMENTS OF THE INVENTION 5.1 Test 1—Graphenization by FSP

During this first test, a brass-coated (Cu/Zn: 60/40) carbon steel thread was subjected to an FSP treatment in order to obtain a reinforcer according to the invention, this process being carried out using the device represented diagrammatically in FIG. 1 (closed glove box swept with a stream of nitrogen) in an atmosphere poor in oxygen ($O_2$ content in the combustion chamber, measured immediately at the chamber outlet, of less then 10 ppm).

Beforehand, this thread with a diameter equal to approximately 0.30 mm (thickness of the brass layer of between 200 and 500 nm) had been cleaned by passing through a 1% aqueous $NH_3$ solution, rinsed with distilled water and dried, everything being under a stream of nitrogen (preferably with the exclusion of air in order to prevent re-oxidation).

This thread, as cathode (−0.5 V with respect to a Ag/AgCl reference electrode), was then subjected to a stage of electrolytic surface copper plating by treatment for approximately 5 s in a bath containing 2 g of copper pyrophosphate hydrate (Aldrich, #34,469-9) and an 85% solution of phosphoric acid in water. A final deposit of a uniform layer of surface metal $M_S$ (copper), with a thickness equal to approximately 3 μm, as attested by SEM (scanning electron microscopy) and by EDS (energy dispersive spectrometry) analyses, was thus obtained, thus perfectly protecting the above thread from corrosion: this is because immersion tests (15 s) in an aqueous bath (solution of water distilled at 100° C.) of sodium thiosulphate ($Na_2S_2O_3$; 5 g/l) and iron(III) nitrate ($Fe(NO_3)_3$; 60 g/l) have revealed the absence of change in colour on the thread thus copper-plated, whereas a control thread (non-copper-plated) exhibited strong surface darkening due to its corrosion.

The thread thus copper-plated, controlled by an automatic device, was then sent through an FSP reactor at a rate of approximately 10 mm/s and at a distance "d" from the flame (F) equal to approximately 70 mm. The combustion chamber (1) was in this instance continuously fed with approximately 5 ml/min of a liquid precursor (P) (mixture of 34% THF and 66% 2-ethylhexanoic acid), 5 l/min of oxygen (oxidation gas 13) and a mixture of methane and oxygen (support gas 14) ($CH_4$: 1.5 ml/min; $O_2$: 2.4 ml/min). The height of the flame (F) was between 6 and 7 cm and the temperature inside the flame was equal to approximately 500° C.

In the present exemplary embodiment and for the various operating conditions above, the combustion and the oxidation of the precursor (P) resulted in a gaseous composition, measured immediately at the chamber outlet by mass spectrometry ("Pfeiffer Quadstar 100") which was as follows (molar %): 1% $H_2O$, 1% $H_2$, 0.5% $CO_2$ and less than 100 ppm $O_2$; furthermore, as the flame produces sufficient CO, no addition of such a gas was necessary.

The appended FIG. 5 reproduces a very-high-resolution transmission electron microscope photograph ((TEM-FEG from FEI; power 300 kV; magnification 620 000) taken of a graphene sample withdrawn at the surface of the thread according to the invention thus treated, by complete dissolution (overnight) of the surface metal $M_S$ in an aqueous solution (6 ml per graphene sample) of $FeCl_3$ (1M); this solution, which became reddish, was subsequently progressively (5 times), slowly, replaced with water until a clear solution was obtained, avoiding the withdrawal of all of the solution and also any contact with the graphene, this process leaving at the end a very thin sheet of graphene floating freely at the surface of the water.

Figure 5:
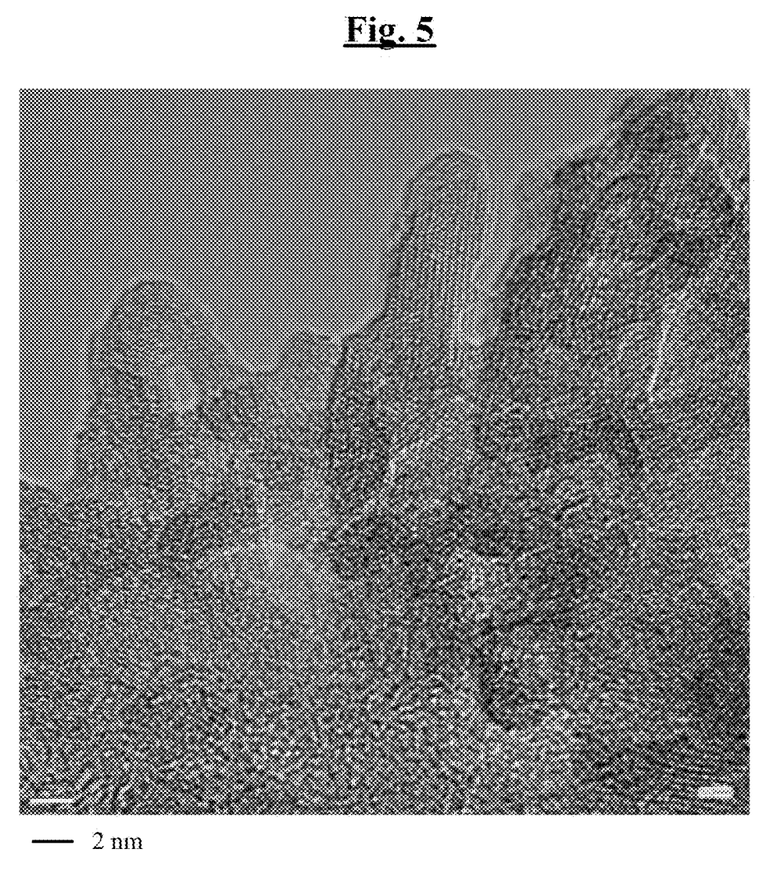

In this photograph of FIG. 5, a distance of 7 mm represents 2 nm; this photograph clearly reveals the carbon atoms (in the form of a hexagonal network) of the withdrawn graphene sheet, this sheet existing here in the form of superimposed monolayers, the number of which is estimated as equal to 1 to 3, depending on the part of the photograph considered.

Figure 6:
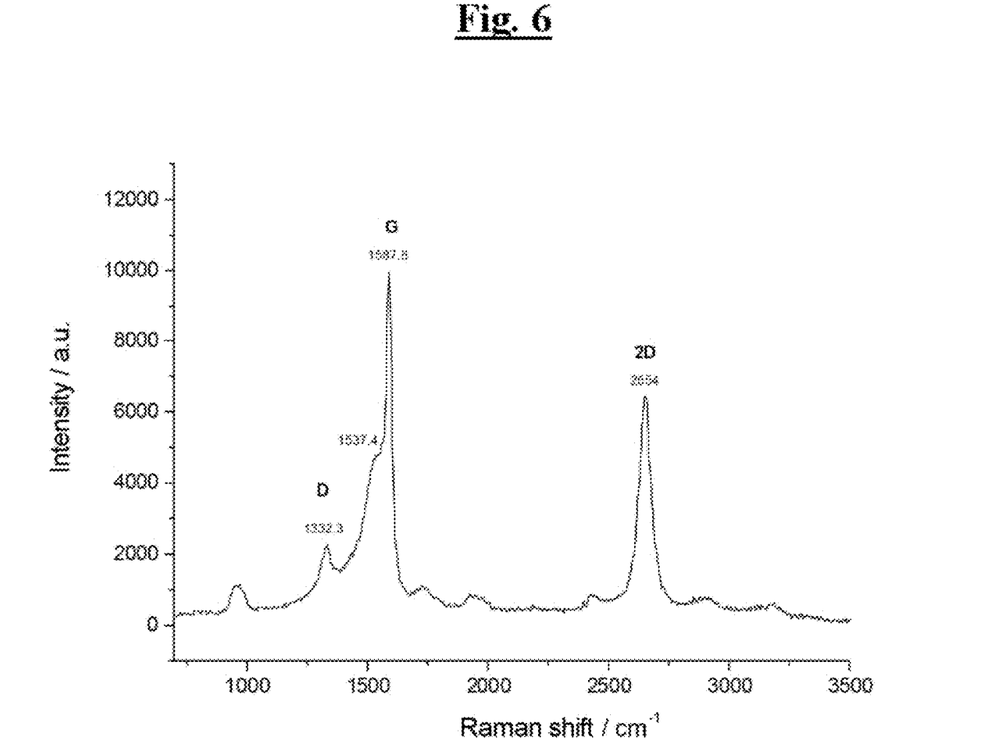

FIG. 6 for its part reproduces a Raman spectrum (confocal micro-Raman spectroscope "CRM 200" from Witec) recorded at 532 nm (2.33 eV excitation; YAG-Nd laser) on another graphene sample (sheet) withdrawn at the surface of the FSP-treated thread as indicated above and deposited on a silicon wafer. The intensity of the signal (in arbitrary units) is indicated on the ordinate and the Raman shift (in cm⁻¹) is indicated on the abscissa.

This spectrum is the typical signature of graphene, in particular clearly distinguishing the latter from graphite; this is because the shapes and the positions of the two peaks at approximately 1588 cm⁻¹ and 2654 cm⁻¹ clearly confirm the presence of graphene in the $sp^2$ hybridized form.

More specifically, the very narrow peak at 1587.8 cm⁻¹ (G band) with a mid-height width of approximately 30 cm⁻¹ corresponds to a graphene monolayer. The other peak (2D band) at 2654 cm⁻¹, strongly shifted towards the blue, with a mid-height width of 60 cm⁻¹, corresponds instead to two superimposed graphene monolayers. The ratio of intensities $I_G/I_{2D}$, greater than 1, is explained by an increased resonance of the G band caused by strong coupling between two differently oriented graphene layers, as may already be perceived by the preceding TEM analysis (FIG. 5).

For the analysis and identification of graphene by Raman spectroscopy, a person skilled in the art may usefully refer to the following publications:

Y. Y. Wang, Z. H. Ni, T. Yu, Z. X. Shen, H. M. Wang, Y. H. Wu, W. Chen and A. T. S., "*Raman Studies of Monolayer Graphene: The Substrate Effect*", J. Phys. Chem. C, 2008, 112, 10637-10640;

K. Kim, S. Coh, L. Z. Tan, W. Regan, J. M. Youk, E. Chatterjee, M. F. Crommie, M. L. Cohen, S. G. Louie and A. Zettl. "*Raman Spectroscopy Study of Rotated Double-Layer Graphene: Misorientation-Angle Dependence of Electronic Structure*"; Phys. Rev. Lett., 2012, 108, 246103, 1-6.

Figure 7:
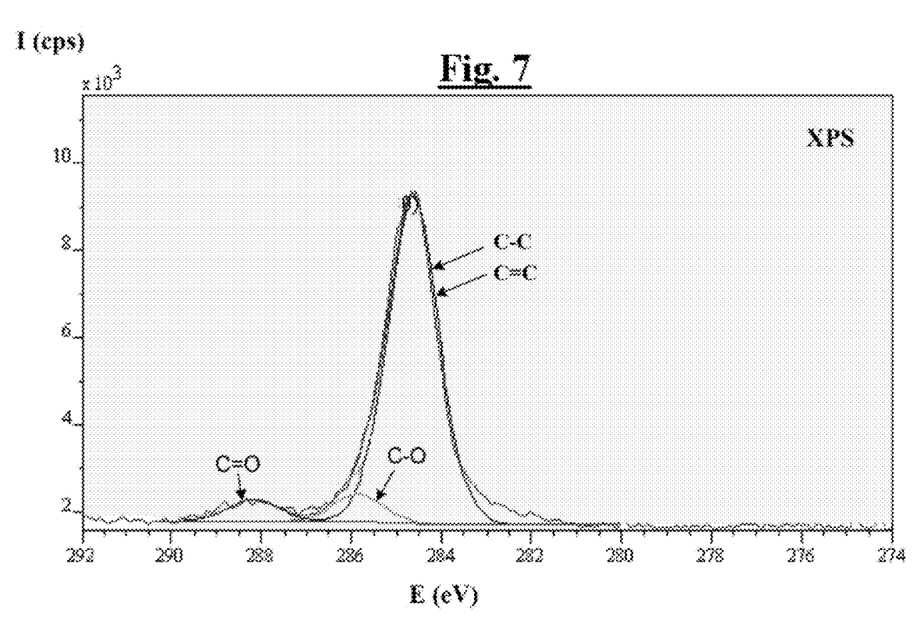

Finally, FIG. 7 reproduces an XPS (X-ray photoelectron spectroscopy) spectrum (Axis Ultra device from Kratos; X-ray source: monochromatic Al Kα (1486.6 eV), 10 mA, 15 kV; ultra-high vacuum less than $10^{-8}$ Torr) taken at the surface of the FSP-treated reinforcer with, on the ordinate, the relative intensity of the signal (in counts/s) and, on the abscissa, the binding energy (in eV). In a known way, this type of analysis makes it possible to access the chemical composition of the surface of the material analysed over a depth of several nanometres, in comparison with known spectra.

The main peak observed at approximately 284.6 eV is in fact the superimposition of two very close peaks, the first at approximately 284.3 eV typical of C=C bonds and the second at approximately 285.1 eV typical of C—C bonds, everything clearly testifying to the presence of graphene ($sp^2$ hybridized graphene) at the surface of the surface metal $M_S$ (copper).

5.2 Test 2—Functionalization of the Graphene 0.2 g of p-phenylenediamine and 0.2 g of sodium nitrite, followed by 0.5 ml of hydrochloric acid (36%), were added to 250 ml of water, for formation of the diazonium salt with the formula described above (X representing, in this example, the Cl⁻ anion):

A sample of the above graphenized thread was then subjected to functionalization (amination) of the graphene by immersion for 2 min in the above aqueous solution stirred using a magnetic bar. The thread thus treated was subsequently extracted from the solution, copiously rinsed with water and then dried under a stream of nitrogen.

Figure 8:
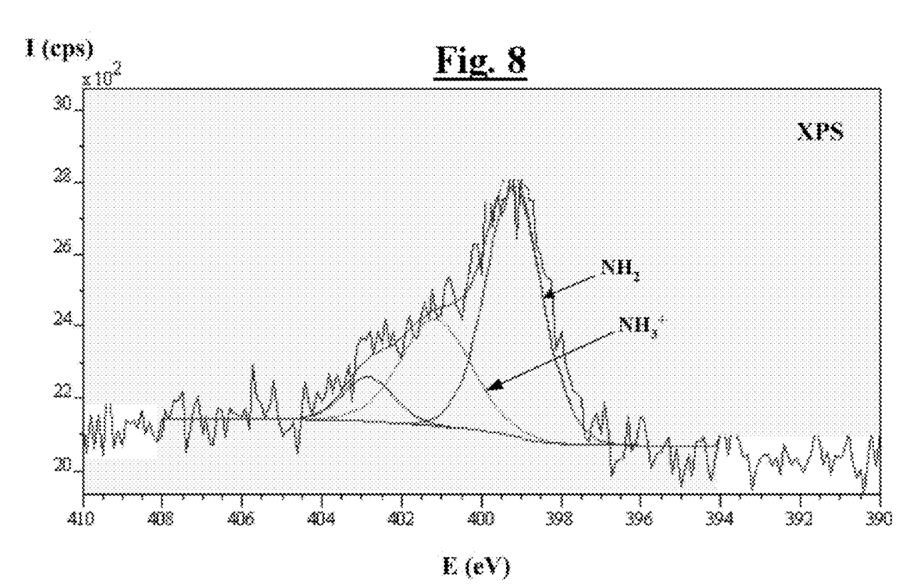

FIG. 8 reproduces the XPS spectrum taken at the surface of the reinforcer graphenized and then functionalized in accordance with the invention. This spectrum clearly confirms the functionalization of the graphene, the two main peaks observed after deconvolution (91% of the total surface area of the 3 visible peaks) being typical of the presence of nitrogen. The peak of highest intensity, at approximately 399 eV, reveals in particular the presence, in a large amount, of $NH_2$ functions attached to an aromatic nucleus.

5.3 Test 3—Crosslinking to a Polymer Matrix

Finally, sections of the carbon steel thread thus treated by FSP, once covered with graphene and then the graphene functionalized, were sandwiched between two layers of a rubber composition for formation of a multilayer laminate.

This conventional rubber composition, for a belt reinforcement of a passenger vehicle tyre, was based on epoxidized (degree of epoxidation of approximately 25 mol %) diene elastomer (natural rubber), on carbon black and silica as filler and on a vulcanization system (sulphur and sulphenamide accelerator), this composition been devoid of cobalt salt.

The metal/rubber composite test specimen thus prepared was then placed under a press and everything was cured at 165° C. for 30 min under a pressure of 20 bar.

After vulcanization of the rubber, excellent adhesive bonding was obtained between the rubber matrix and the metal reinforcer according to the invention, despite the absence of cobalt salt in the rubber matrix; this is because, during peel tests carried out at ambient temperature (20° C.), it was found that the failure occurred systematically in the rubber matrix itself and not at the interface between (graphenized) metal and rubber.

During comparative tests, carried out under the same conditions (no cobalt salt in the rubber matrix) on an equivalent metallic thread devoid, on its surface metal $M_S$, of functionalized graphene, it was found that the metallic reinforcer did not adhesively bond at all to the rubber.

In conclusion, the reinforcers in accordance with the invention can be efficiently protected from corrosion by virtue of the graphene present at their surface; advantageously, they can be adhesively bonded directly, without adhesion primer or addition of metal salt (in particular of cobalt salt), to unsaturated rubber matrices, such as natural rubber, by virtue of the possible functionalization of this graphene.

The invention claimed is:

1. A threadlike metallic or metallized reinforcer, at the periphery of which is positioned a layer of surface metal selected from the group consisting of copper, nickel and copper/nickel alloys, wherein the layer of surface metal is itself coated, at least in part, with at least one layer of graphene.

2. The reinforcer according to claim 1, wherein the reinforcer is in the form of an individual thread or an assembly of threads.

3. The reinforcer according to claim 1, wherein the reinforcer is in the form of a tape or a film.

4. The reinforcer according to claim 1, wherein the surface metal is copper.

5. The reinforcer according to claim 1, wherein the reinforcer is an entirely metallic reinforcer.

6. The reinforcer according to claim 5, wherein the metal at the core of the metallic reinforcer is a steel.

7. The reinforcer according to claim 6, wherein the steel is a carbon steel.

8. The reinforcer according to claim 6, wherein the steel is coated, at least in part, with a substrate metal which acts as substrate for the layer of the surface metal.

9. The reinforcer according to claim 8, wherein the substrate metal is selected from the group consisting of aluminum, cobalt, tin, manganese, molybdenum, zinc and alloys comprising at least one of these elements.

10. The reinforcer according to claim 9, wherein the substrate metal is selected from the group consisting of cobalt, zinc and alloys comprising at least one of these elements.

11. The reinforcer according to claim 10, wherein the substrate metal is brass.

12. The reinforcer according to claim 1, wherein the thickness of the reinforcer, or its diameter when its cross section is circular in shape, is between 0.05 and 5 mm.

13. The reinforcer according to claim 12, wherein the thickness of the reinforcer, or its diameter when its cross section is circular in shape, is between 0.1 and 1 mm.

14. The reinforcer according to claim 1, wherein the number of graphene layers varies from 1 to 5.

15. The reinforcer according to claim 14, wherein the number of graphene layers varies from 2 to 4.

16. The reinforcer according to claim 1, wherein there is grafted, to the graphene, at least one functional group which can crosslink to a polymer matrix.

17. The reinforcer according to claim 16, wherein the functional group comprises at least one function selected from the group consisting of $NH_2$, NHR, —OH, —COOH, —CHO, —SH, —$S_X$—, halogen, acrylate, methacrylate, epoxy, vinyl, vinyloxy or isocyanate functions, where R is a hydrocarbon radical and x is greater than 1.

18. The reinforcer according to claim 17, wherein the functional group corresponds to the formula:

wherein m is equal to 0 or to 1; n is an integer from 1 to 5; Z is an optional, at least divalent, bonding group.

19. The reinforcer according to claim 18, wherein the functional group corresponds to the formula:

* * * * *